(12) United States Patent
Uya

(10) Patent No.: US 7,488,615 B2
(45) Date of Patent: Feb. 10, 2009

(54) METHOD OF MANUFACTURING A SOLID-STATE IMAGING DEVICE

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 200 days.

(21) Appl. No.: 11/656,450

(22) Filed: Jan. 23, 2007

(65) Prior Publication Data

US 2007/0172970 A1    Jul. 26, 2007

(30) Foreign Application Priority Data

Jan. 25, 2006   (JP)   ............... P2006-016609

(51) Int. Cl.
*H01L 21/00* (2006.01)
(52) U.S. Cl. ............... 438/48; 438/70; 257/290; 257/291; 257/292; 257/294; 257/E27.159; 257/E27.133; 257/E27.134; 257/E27.142
(58) Field of Classification Search ............ 438/48, 438/70; 257/290–292, 294, E27.159, E27.133, 257/E27.134, E27.142
See application file for complete search history.

(56) References Cited

U.S. PATENT DOCUMENTS

| | | | | |
|---|---|---|---|---|
| 5,306,926 A | * | 4/1994 | Yonemoto | 257/432 |
| 5,371,397 A | * | 12/1994 | Maegawa et al. | 257/432 |
| 6,188,094 B1 | * | 2/2001 | Kochi et al. | 257/232 |
| 6,605,850 B1 | * | 8/2003 | Kochi et al. | 257/431 |
| 6,753,557 B2 | * | 6/2004 | Nakai | 257/233 |
| 2006/0138481 A1 | * | 6/2006 | Suzuki | 257/291 |

FOREIGN PATENT DOCUMENTS

| | | |
|---|---|---|
| JP | 2003-60179 A | 2/2003 |
| JP | 2003-224249 A | 8/2003 |
| JP | 2005-116841 A | 4/2005 |

* cited by examiner

*Primary Examiner*—Andy Huynh
(74) *Attorney, Agent, or Firm*—Birch, Stewart, Kolasch & Birch, LLP

(57) ABSTRACT

A method of manufacturing a solid-state imaging device, wherein the solid-state imaging device comprising: a semiconductor substrate; a plurality of photodiodes that are formed on a surface of the semiconductor substrate so as to be arranged in an array form; and a light shielding film, provided on or above the surface of the semiconductor substrate, that has a plurality of openings in correspondence with respective ones of the photodiodes, the method comprising: laminating, on the surface of the semiconductor substrate, lamination layers including the light shielding film; opening through holes in the lamination layers, respectively, at positions corresponding to the photodiodes to form the openings in the light shielding film; forming a low refractive index material layer with a predetermined thickness isotropically on a side wall surface of each of the through holes; and filling a remaining hole portion of each of the through holes with a high refractive index material to form an optical waveguide for guiding incident light to each of the photodiodes.

7 Claims, 10 Drawing Sheets

METHOD OF MANUFACTURING A SOLID-STATE IMAGING DEVICE

BACKGROUND OF THE INVENTION

1. Field of the Invention

The present invention relates to a method of manufacturing a solid-state imaging device, and more particularly to a method of manufacturing a solid-state imaging device in which a light-shielding-film opening is provided on a light receiving surface of each photodiode for constituting a pixel.

2. Description of the Related Art

FIG. 9 is a schematic surface diagram of a CCD-type image sensor which is an example of the solid-state imaging device. In this solid-state imaging device 1, a multiplicity of photodiodes (PDs) 3 are formed on the surface of a semiconductor substrate 2 by being arranged in the form of an array, i.e., in the form of a square lattice in the illustrated example. In addition, a vertical transfer path (VCCD) 4 for receiving and transferring signal charges accumulated by the photodiodes 3 in correspondence with the amounts of light received is provided on a side of each row of the photodiodes. A horizontal transfer path (HCCD) 5 for transferring the signal charges received from the vertical transfer paths 4 to an output stage is provided at a lower side of the semiconductor substrate 2, and an amplifier 6 for outputting voltage value signals corresponding to the amounts of signal charges is provided at the output stage of the horizontal transfer path 5. A light shielding film, a color filter layer, and a microlens layer, which will be described later, are provided on the surface of each photodiode 3.

FIG. 10 is a schematic cross-sectional view taken along line X-X in FIG. 9, and illustrates a section of one photodiode portion. In addition, FIGS. 11 to 15 are diagrams illustrating the procedure for manufacturing this related-art solid-state imaging device. Hereafter, a description will be given of the procedure for manufacturing the related-art solid-state imaging device.

As shown in FIG. 11, a p-well layer 11 is formed in a surface portion of an n-type semiconductor substrate 2, and an n region 12 is formed in a surface portion of the p-well layer 11 to thereby form a photodiode. An embedded channel 4a for constituting a vertical transfer path 4 is formed near a side portion of the n region 12, while a p⁺ diffusion layer 13 for suppressing a dark current is provided on a surface portion of the n region 12.

The outermost surface of the semiconductor substrate 2 is covered with a gate insulating layer 14, and a transfer electrode 4b for constituting the vertical transfer path 4 is laminated on the embedded channel 4a with the gate insulating layer 14 disposed therebetween. The semiconductor substrate 2 is further covered with an insulating layer 15, and a metallic light shielding film 16 formed of tungsten or the like is laminated thereon. An opening 16a of the light shielding film 16 is open at a position above the light receiving surface of the n region 12.

As shown in FIG. 12, a flattening layer 17 is laminated on the light shielding film 16. Then, as shown in FIG. 13, a through hole 18 which penetrates the flattening layer 17 and the insulating layer 15 is formed by the photolithographic process. This through hole 18 is provided such that its side wall is spaced apart from the side wall of the light shielding film opening 16a.

Next, as shown in FIG. 14, a high refractive index layer 19 is laminated by using a film forming method such as plasma CVD or by a coating method to fill the through hole 18. As a result, an optical waveguide 20 made of a high refractive index material is formed in the interior of the through hole 18. Then, as shown in FIG. 15, an upwardly convex inner lens 21 formed of a high refractive index material is laminated on the optical waveguide 20. Furthermore, a flattening layer 22, a color filter layer 23, and a top microlens layer 24 are laminated thereon, as shown in FIG. 10.

In the solid-state imaging device manufactured by the above-described manufacturing procedure, the incident light is focused by the microlenses 24 and 21, is guided into the optical waveguide 20, passes through the interior of the optical waveguide 20, and enters the n region 12. As a result, photoelectric charge is generated and accumulated in the n region 12.

It should be noted that, for example, JP-A-2003-60179, JP-A-2003-224249 and JP-A-2005-116841 are known as relating to the related art.

In solid-state imaging devices in recent years, attempts have been made to increase the number of pixels to millions of pixels or even higher, so that the diameters of the optical waveguide 20 and the light shielding film opening 16a have come to be microfabricated on the order of the wavelength of the incident light.

If the optical waveguide 20 and the light shielding film opening 16a become very fine, new problems which hitherto did not constitute problems emerge. One of them is the loss of light energy due to an evanescent effect. Namely, this is a problem in that when the incident light passes through the interior of the optical waveguide 20, if the evanescent light oozing out from the side wall of the optical waveguide 20 to the outer periphery is shielded by the light shielding film, the loss of energy increases sharply, causing a decline in sensitivity.

To avoid this problem, it suffices if the optical waveguide 20 is formed with a diameter sufficiently smaller than the microfabricated light shielding film opening 16a, but since the optical waveguide 20 itself is formed with a small diameter, the decline in sensitivity still results. In addition, in the related-art manufacturing method, there is no guarantee that the optical waveguide 20 can be formed just in the middle of the light shielding film opening 16a, and there is a possibility that the optical waveguide 20 is offset in the light shielding film opening 16a owing to process variations, and becomes very close to the light shielding film 16.

SUMMARY OF THE INVENTION

An object of the invention is to provide a method of manufacturing a solid-state imaging device in which the distance between the light shielding film opening and the optical waveguide can be kept to a predetermined value in a self-aligned manner.

In accordance with the invention, there is provided a method of manufacturing a solid-state imaging device, wherein the solid-state imaging device comprising: a semiconductor substrate; a plurality of photodiodes that are formed on a surface of the semiconductor substrate so as to be arranged in an array form; and a light shielding film, provided on or above the surface of the semiconductor substrate, that has a plurality of openings in correspondence with respective ones of the photodiodes, the method comprising: laminating, on the surface of the semiconductor substrate, lamination layers including the light shielding film; opening through holes in the lamination layers, respectively, at positions corresponding to the photodiodes to form the openings in the light shielding film; forming a low refractive index material layer with a predetermined thickness isotropically on a side wall surface of each of the through holes; and filling a remaining hole portion of each of the through holes with a high refractive index material to form an optical waveguide for guiding incident light to each of the photodiodes.

In accordance with the invention, there is provided the method of manufacturing a solid-state imaging device, forming, in advance, a reflection preventing film comprising a high refractive index material on each of portions of a gate insulating layer on the semiconductor substrate which corresponds to a receiving surface of each of the photodiodes, wherein the reflection preventing film is used as an etching stopper when the through hole is opened.

DETAILED DESCRIPTION OF THE INVENTION

Hereafter, a description will be given of an embodiment of the invention with reference to the accompanying drawings.

Figure 1:
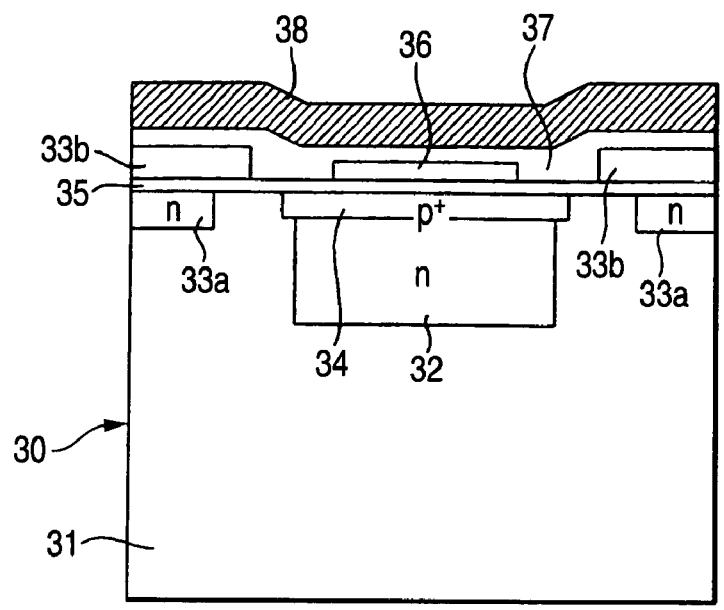
FIG. 1 is an explanatory diagram of the procedure for manufacturing a solid-state imaging device in accordance with an embodiment of the invention.

FIGS. 1 to 8 are diagrams illustrating the procedure of manufacturing a solid-state imaging device in accordance with an embodiment of the invention. In the solid-state imaging device in accordance with this embodiment, as shown in FIG. 1, a p-well layer 31 is formed in a surface portion of an n-type semiconductor substrate 30, and an n region 32 is formed in a surface portion of the p-well layer 31 to thereby form a photodiode. An embedded channel 33a for constituting a vertical transfer path is formed near a side portion of the n region 32, while a p$^+$ diffusion layer 34 for suppressing a dark current is provided on a surface portion of the n region 32. It should be noted that a p-type semiconductor substrate 30 may be provided instead of providing the p-well layer 31.

The outermost surface of the semiconductor substrate 30 is covered with a gate insulating layer 35, and a transfer electrode 33b for constituting the vertical transfer path is laminated on the embedded channel 33a with the gate insulating layer 35 disposed therebetween. In addition, a reflection preventing film 36 formed of a high refractive index material such as silicon nitride (SiN) is laminated on the gate insulating layer 35 at a position above the n region 32. This reflection preventing film 36 also functions as a stopper at the time of etching. The semiconductor substrate 30 is further covered with an insulating layer 37, and a metallic light shielding film 38 formed of tungsten or the like is laminated thereon.

Figure 2:
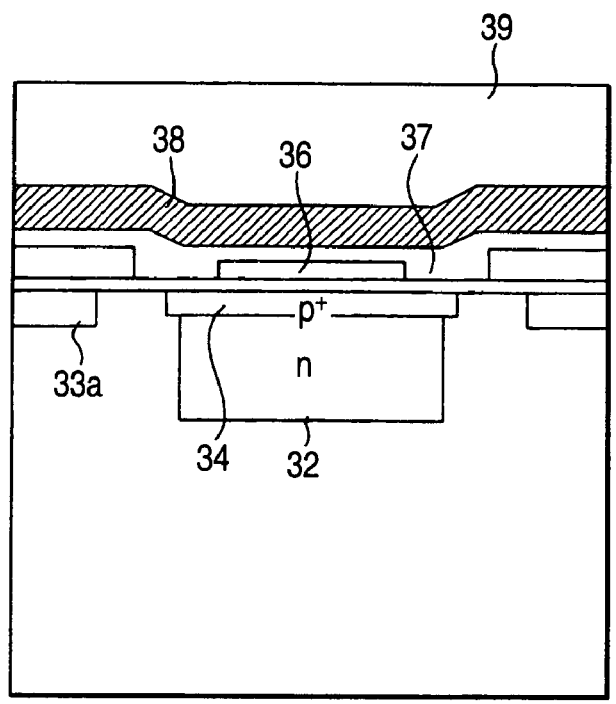
FIG. 2 is a diagram illustrating a manufacturing procedure following FIG. 1.
Figure 3:
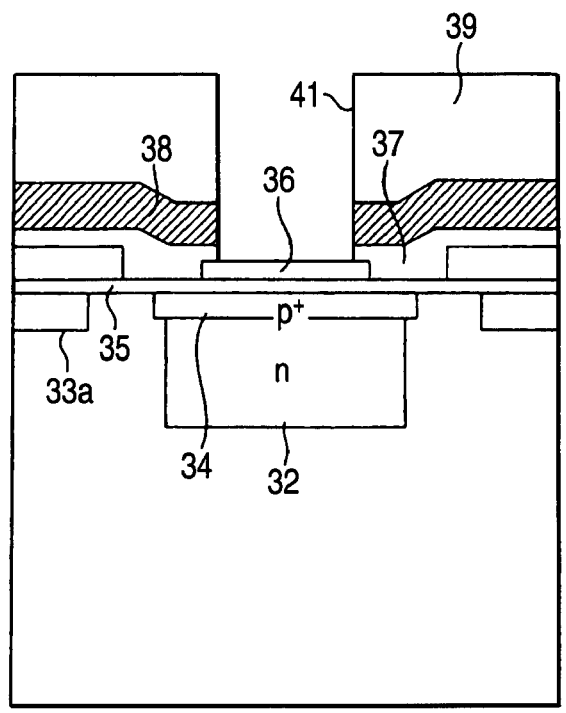
FIG. 3 is a diagram illustrating a manufacturing procedure following FIG. 2.

Next, as shown in FIG. 2, a flattening layer 39 is laminated, and its surface is flattened by such as etch-backing and chemical mechanical polishing (CMP). Then, as shown in FIG. 3, a through hole 41 which penetrates the flattening layer 39, the light shielding layer 38, and the insulating layer 37 and reaches the reflection preventing film 36 is formed by the photolithographic process.

Figure 4:
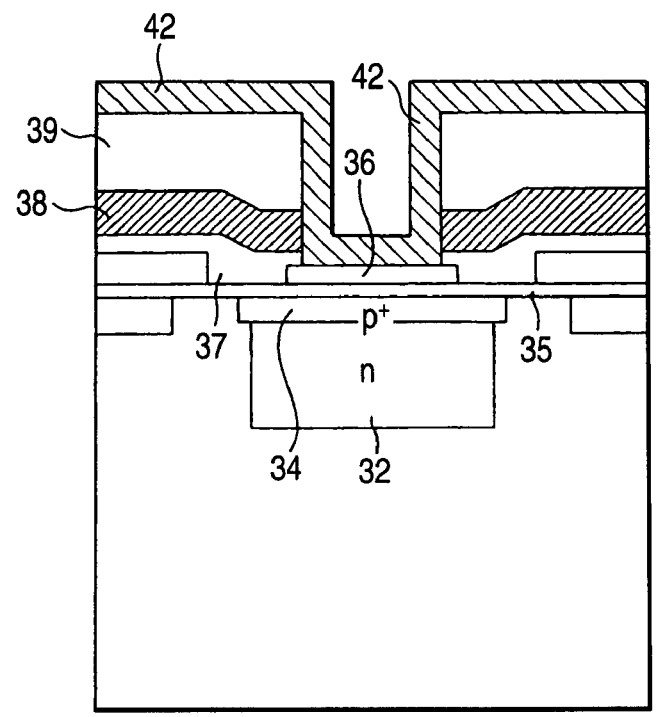
FIG. 4 is a diagram illustrating a manufacturing procedure following FIG. 3.

Next, as shown in FIG. 4, a low refractive index material such as SiO2 is formed with a predetermined thickness by using a film forming technique such as plasma CVD. As a result, a low refractive index material layer 42 is laminated isotropically on a side wall portion and a bottom in the interior of the through hole 41 and on the surface of the flattening layer 39.

Figure 5:
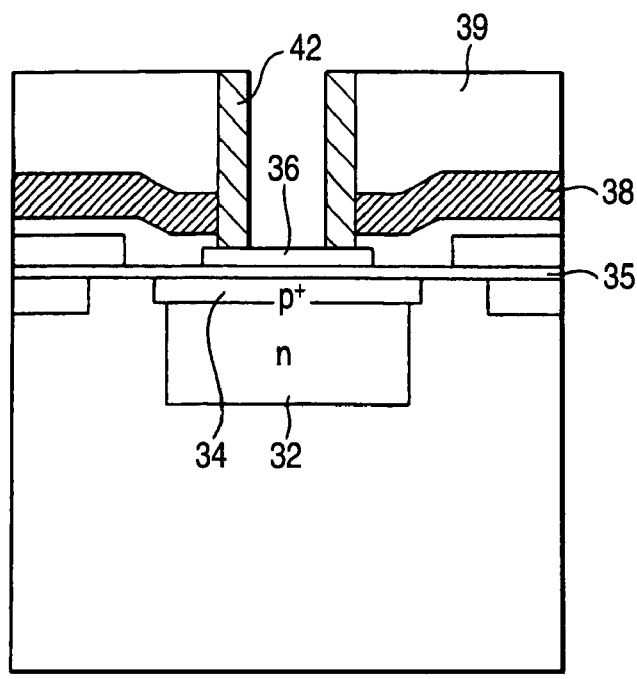
FIG. 5 is a diagram illustrating a manufacturing procedure following FIG. 4.

Next, anisotropic etching such as reactive ion etching (RIE) is performed to remove the low refractive index material layer 42 on the bottom of the through hole 41 and on the surface of the flattening layer 39, while leaving the low refractive index material layer 42 on the side wall portion of the through hole 41, as shown in FIG. 5.

Figure 6:
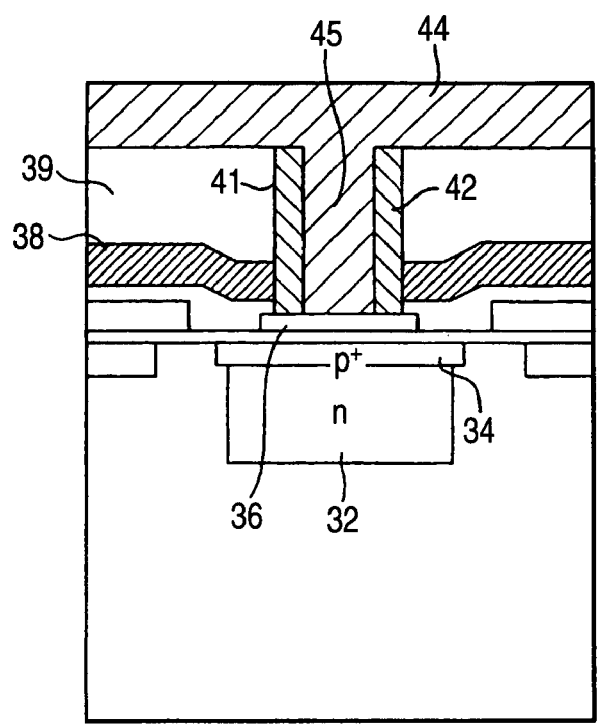
FIG. 6 is a diagram illustrating a manufacturing procedure following FIG. 5.

Next, as shown in FIG. 6, a high refractive index material layer 44 such as SiN is laminated on the surface of the flattening layer 39 by a coating method or the like, and the remaining portion inside the through hole 41 is filled with a high refractive index material 45; The portion inside this throughhole 4 serves as an optical waveguide 45.

Figure 7:
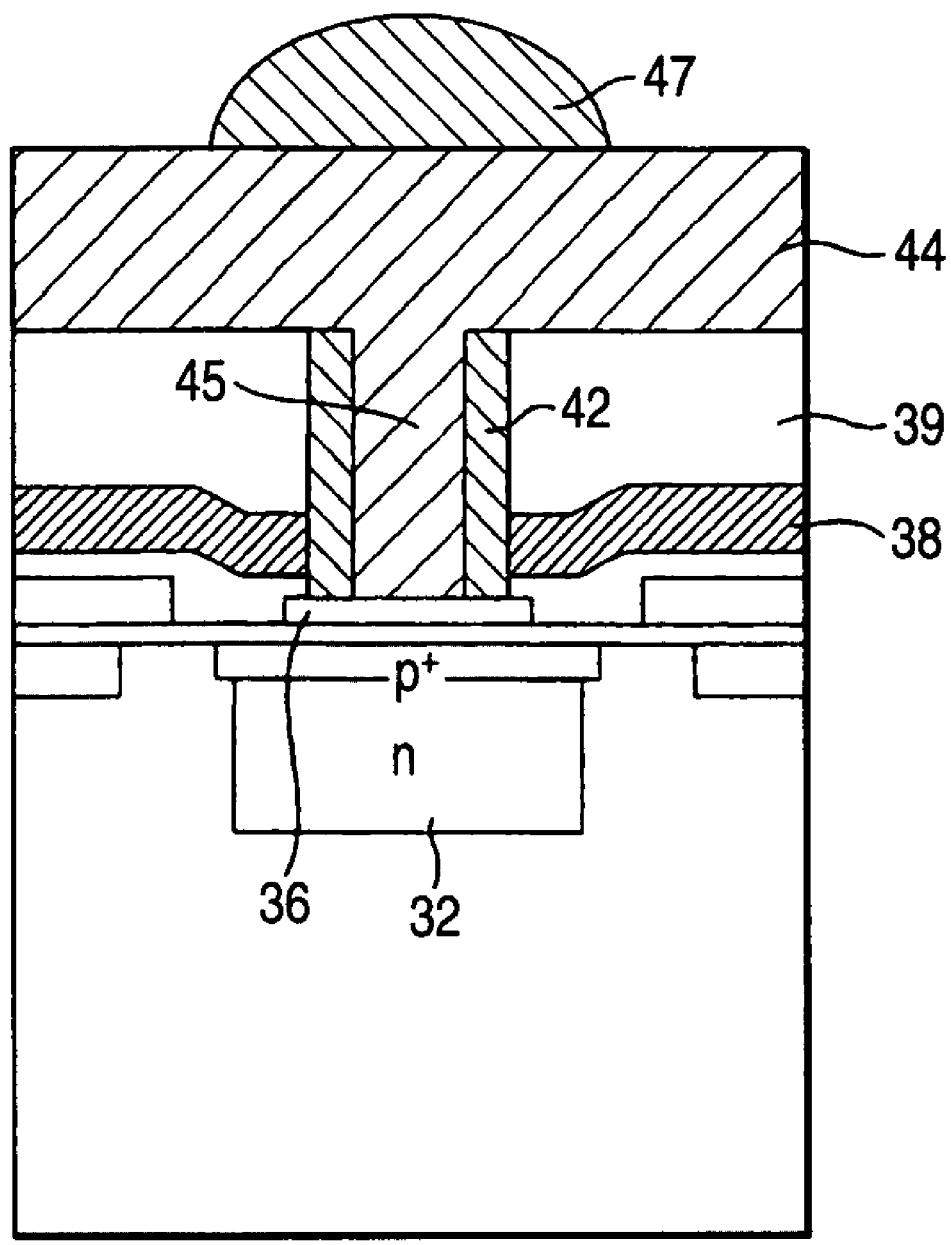
FIG. 7 is a diagram illustrating a manufacturing procedure following FIG. 6.
Figure 8:
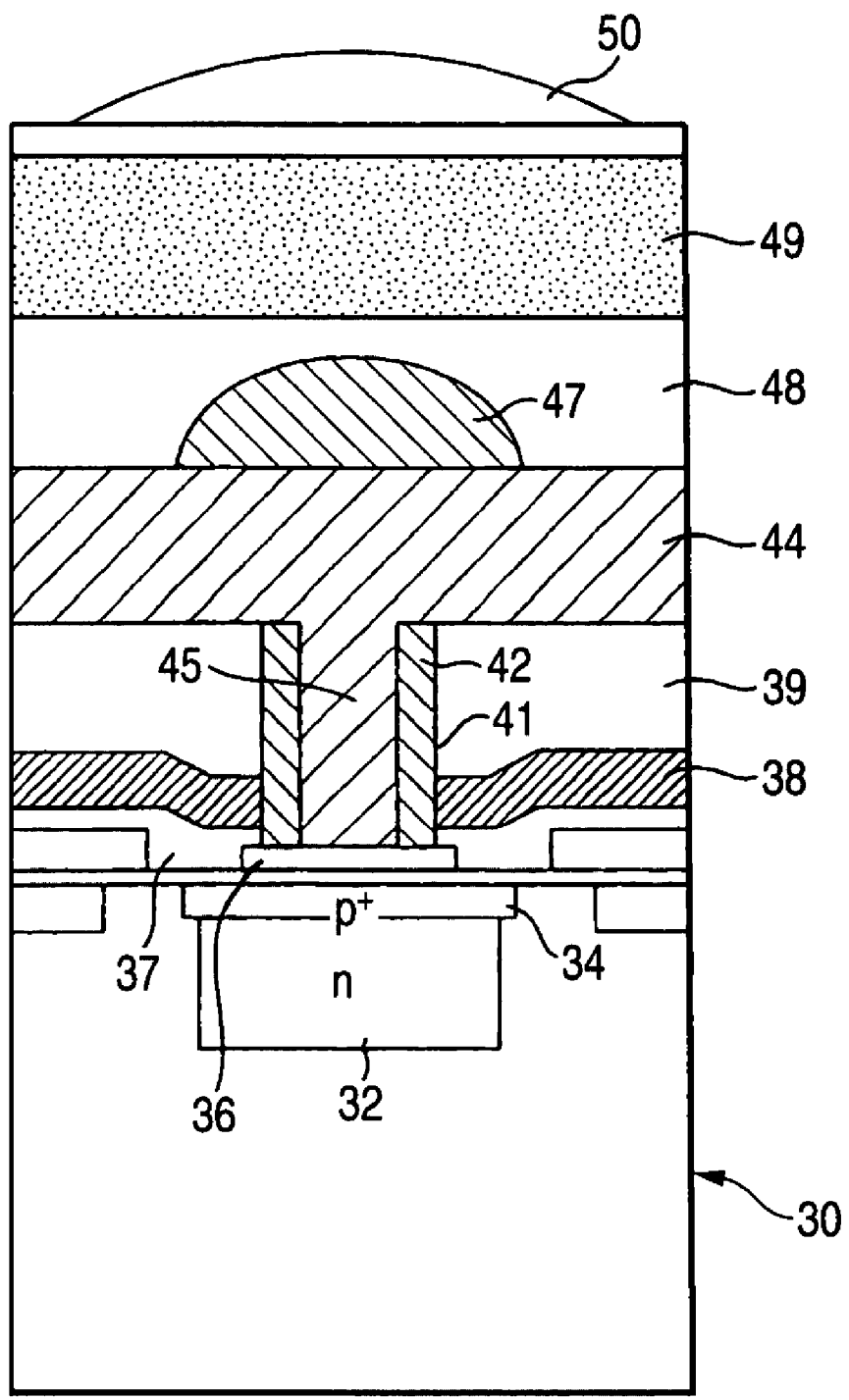
FIG. 8 is a diagram illustrating a manufacturing procedure following FIG. 7.
Figure 9:
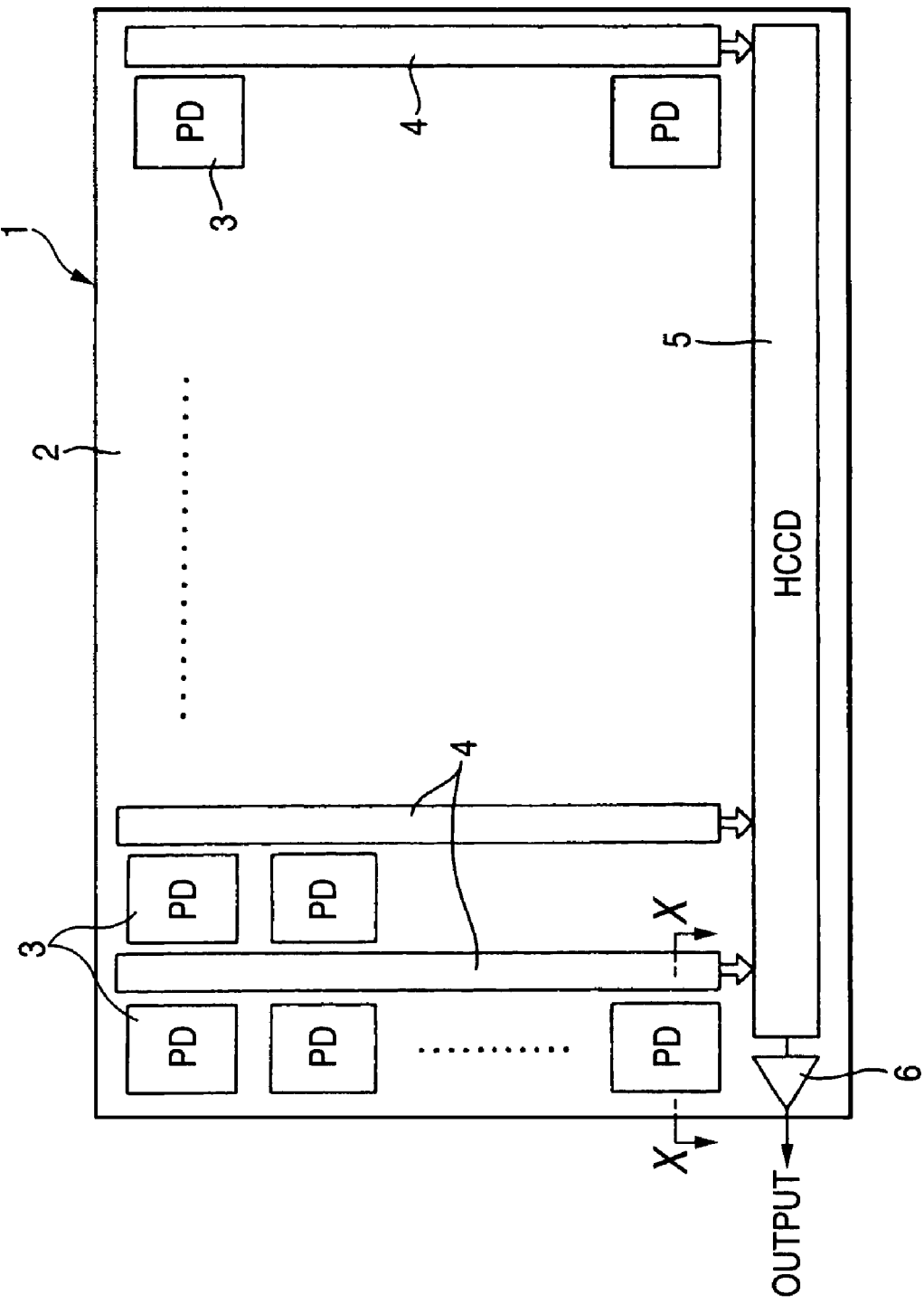
FIG. 9 is a schematic surface diagram illustrating an example of the solid-state imaging device.
Figure 10:
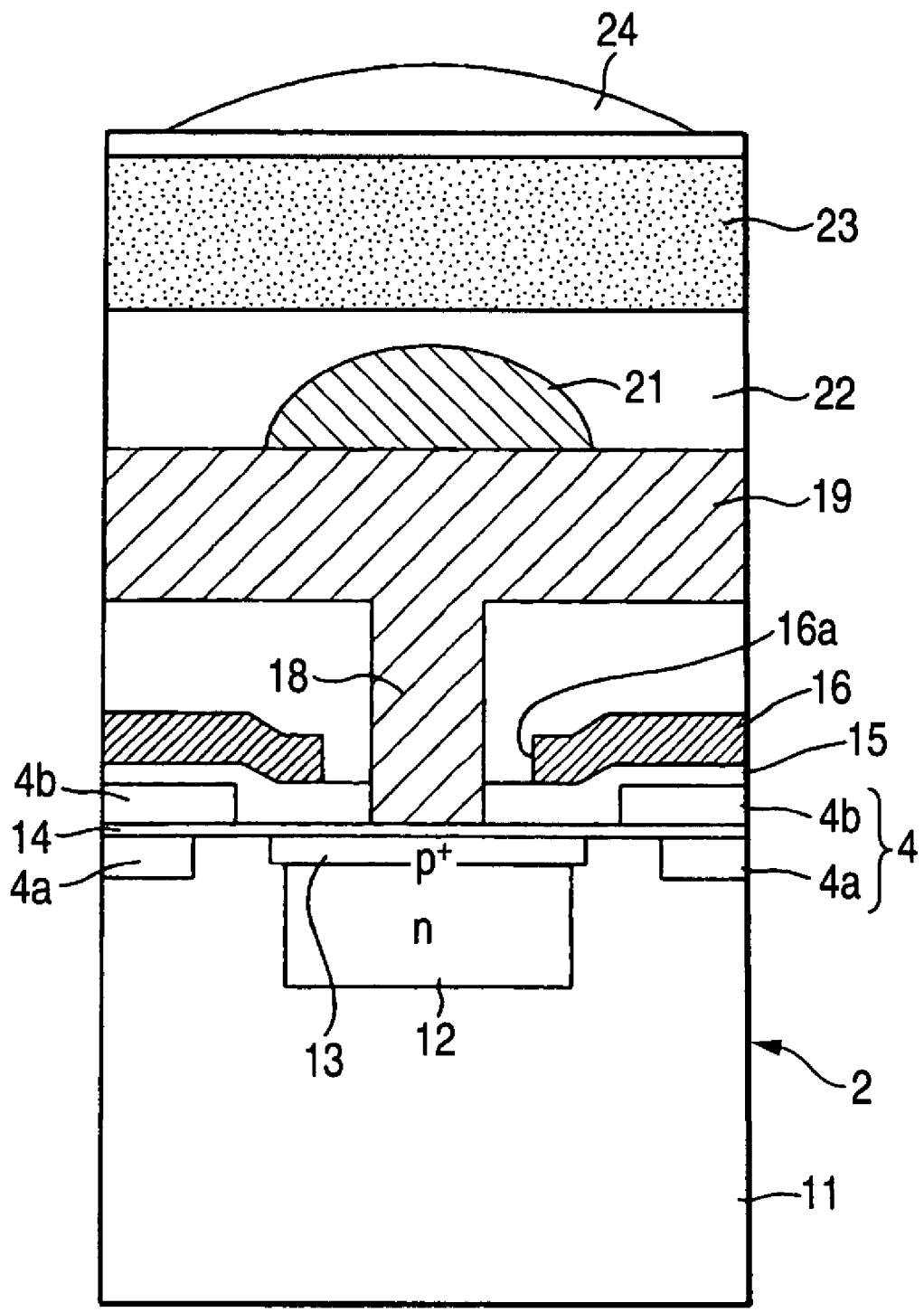
FIG. 10 is a schematic cross-sectional view of the related-art solid-state imaging device, illustrating a cross-section at the position of a line X-X in FIG. 9.
Figure 11:
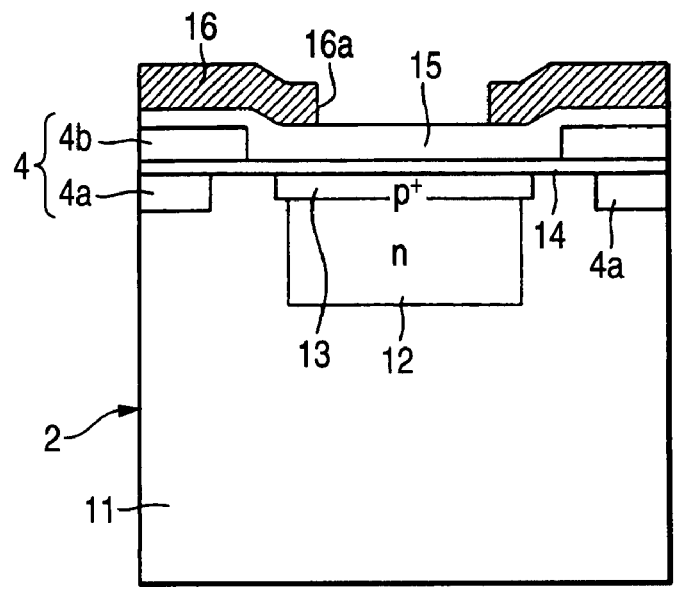
FIG. 11 is a diagram explaining the procedure for manufacturing the related-art solid-state imaging device.
Figure 12:
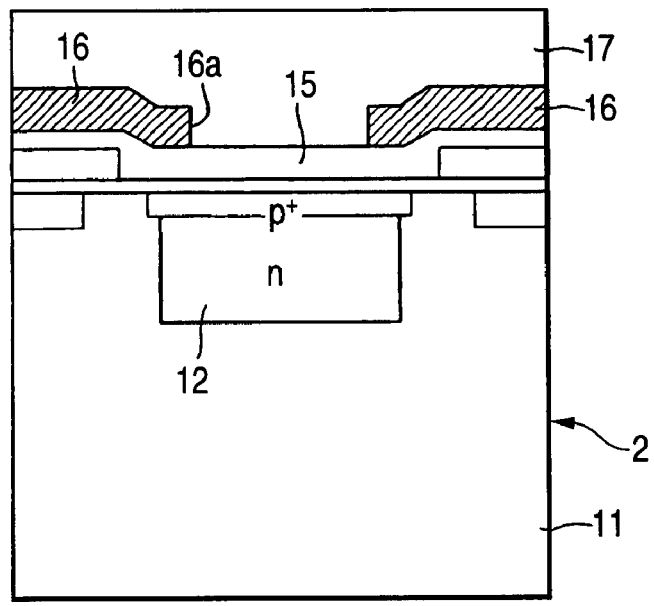
FIG. 12 is a diagram illustrating the procedure for manufacturing the related-art solid-state imaging device following FIG. 11.
Figure 13:
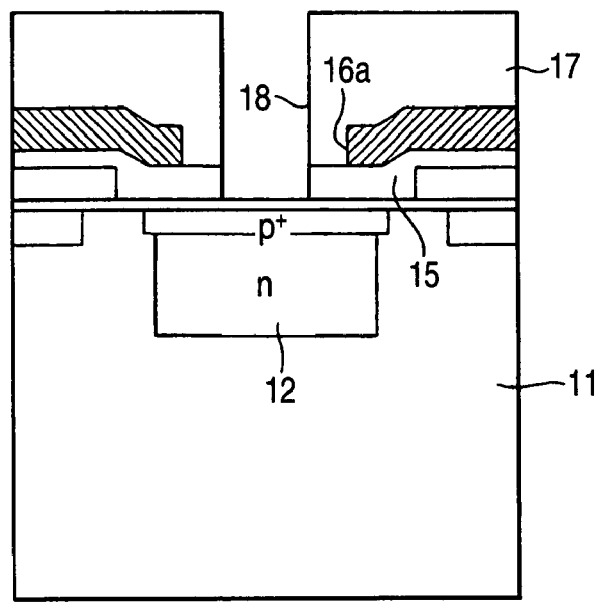
FIG. 13 is a diagram illustrating the procedure for manufacturing the related-art solid-state imaging device following FIG. 12.
Figure 14:
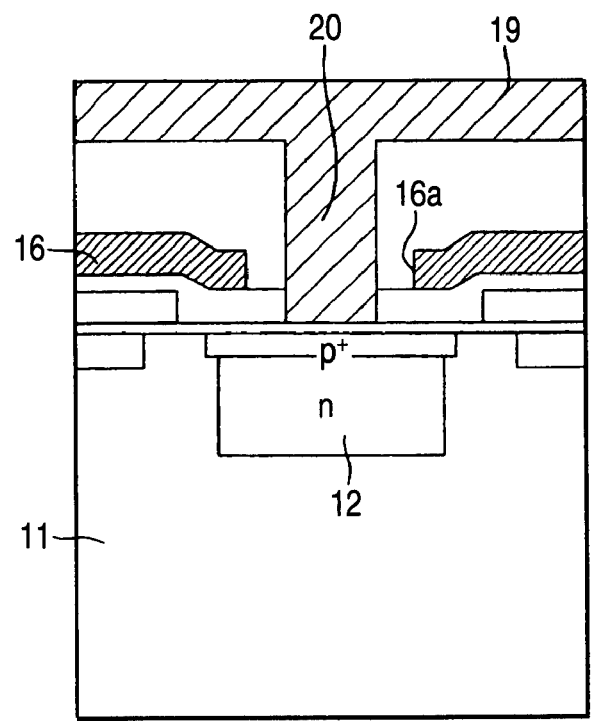
FIG. 14 is a diagram illustrating the procedure for manufacturing the related-art solid-state imaging device following FIG. 13.
Figure 15:
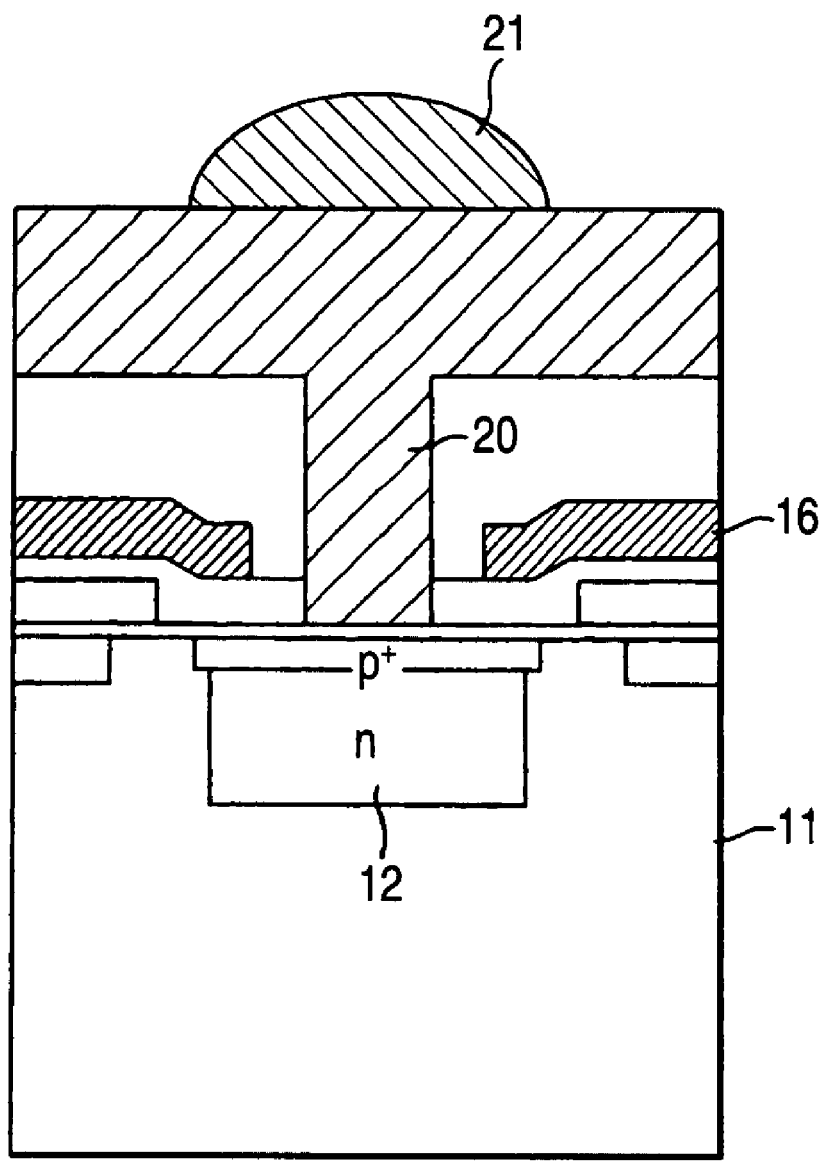
FIG. 15 is a diagram illustrating the procedure for manufacturing the related-art solid-state imaging device following FIG. 14.

Then, as shown in FIG. 7, an upwardly convex inner lens 47 made of a high refractive index material (e.g., SiN) is formed on the high refractive index material layer 44 at a position above the optical waveguide 45. In addition, as shown in FIG. 8, a flattening layer 48 is laminated thereon, and a color filter layer 49 and a top microlens 50 are further formed thereon.

In the solid-state imaging device in accordance with this embodiment manufactured by the above-described manufacturing procedure, the incident light is focused by the microlenses 50 and 47, is guided into the optical waveguide 45, and travels inside the optical waveguide 45 in the direction toward the n region 32.

At this time, the light which traveled in the direction toward the side wall of the optical waveguide 45 is totally reflected by the low refractive index layer 42 and is returned to the interior of the optical waveguide 45, but evanescent light (near field light) slightly oozes out from the optical waveguide 45 toward the low refractive index layer 42 side. This oozing distance is at most approximately equal to the wavelength of the light, but the distance at which the intensity of the light becomes 1/e is about a fraction of the wavelength. Therefore, if the thickness of the low refractive index layer 42 is set to the wavelength of the light or thereabouts, the evanescent light does not strike the light shielding film 38, so that it is possible to avoid a decline in sensitivity which could be otherwise caused owing to it.

In addition, in the solid-state imaging devices with attempts made toward an ultra high number of pixels in recent years, since the diameters of the optical waveguide and the light shielding film opening are miniaturized on the order of the wavelength of the incident light, there are cases where the thickness of the low refractive index layer 42 cannot be set to the thickness of the wavelength or thereabouts. Even in this case, if it is possible to secure the low refractive index layer 42 with a thickness of a fraction of the wavelength, e.g., a thickness of, for instance, 0.1 μm or thereabouts, even if the evanescent light strikes the light shielding film, the most of the intensity of that light does not attenuate.

In this embodiment, even if process variations occur, since the low refractive index layer 42 with a predetermined thickness can be reliably formed around the side wall of the optical waveguide 45, it is possible to secure the distance from the side wall of the opening of the light shielding film 42 to the outer peripheral side wall of the optical waveguide 45. Hence, it becomes unnecessary to form the diameter of the optical waveguide with a small size by taking the process variations into consideration.

In addition, at the time of etching for opening the through hole 41 explained with reference to FIG. 3, the reflection preventing film 36 functions as a stopper of etching, so that the distance between the bottom surface of the through hole 41 (the bottom surface of the optical waveguide 45) and the obverse surface of the semiconductor substrate 30 (the obverse surface of the $p^+$ diffusion layer 34) can be set to a fixed distance. If the stopper layer 36 is not present, this distance would become instable for each pixel, and the sensitivity would vary for each pixel. However, since the stopper layer 36 is provided, it is possible to suppress the variation in sensitivity for each pixel.

It should be noted that although, in the related art and the embodiment described above, a description has been given by citing a CCD-type solid-state imaging device as an example, the invention is not limited to the CCD-type solid-state imaging devices, and is also applicable to other types of solid-state imaging device such as a CMOS image sensor.

According to the invention, even if evanescent light oozes out from the side wall of the optical waveguide, since the low refractive index layer is present in between up to the light shielding film, the attenuation of the light intensity is suppressed. For this reason, a decline in sensitivity due to the evanescent effect can be avoided.

The method of manufacturing a solid-state imaging device in accordance with the invention is capable of suppressing a decline in sensitivity due to the evanescent effect, and is therefore useful as a method of manufacturing a solid-state imaging device with an attempt made toward a greater number of pixels.

What is claimed is:

1. A method of manufacturing a solid-state imaging device, wherein the solid-state imaging device comprising:
    a semiconductor substrate;
    a plurality of photodiodes that are formed on a surface of the semiconductor substrate so as to be arranged in an array form; and
    a light shielding film, provided on or above the surface of the semiconductor substrate, that has a plurality of openings in correspondence with respective ones of the photodiodes,
    the method comprising:
    laminating, on the surface of the semiconductor substrate, lamination layers including the light shielding film;
    opening through holes in the lamination layers, respectively, at positions corresponding to the photodiodes to form the openings in the light shielding film;
    forming a low refractive index material layer with a predetermined thickness isotropically on a side wall surface of each of the through holes; and
    filling a remaining hole portion of each of the through holes with a high refractive index material to form an optical waveguide for guiding incident light to each of the photodiodes.

2. The method of manufacturing a solid-state imaging device according to claim 1,
    forming, in advance, a reflection preventing film comprising a high refractive index material on each of portions of a gate insulating layer on the semiconductor substrate which corresponds to a receiving surface of each of the photodiodes,
    wherein the reflection preventing film is used as an etching stopper when the through hole is opened.

3. The method of manufacturing a solid-state imaging device according to claim 1,
    wherein the low refractive index material layer is formed with plasma CVD.

4. The method of manufacturing a solid-state imaging device according to claim 1,
    wherein the low refractive index material layer has a thickness of 0.1 μm or more.

5. The method of manufacturing a solid-state imaging device according to claim 1,
    wherein the low refractive index material layer comprises $SiO_2$.

6. The method of manufacturing a solid-state imaging device according to claim 1,
    wherein the high refractive index material comprises SiN.

7. The method of manufacturing a solid-state imaging device according to claim 1, further comprising:
    forming an upwardly convex inner lens on or above the high refractive index material forming the optical waveguide;
    forming a flattening layer on the upwardly convex inner lens;
    forming a color filter layer on or above the flattening layer; and
    forming a top microlens on or above the color filter layer.

* * * * *